(12) United States Patent
Hsu

(10) Patent No.: US 7,928,751 B2
(45) Date of Patent: Apr. 19, 2011

(54) MEMS INTERCONNECTION PINS FABRICATION ON A REUSABLE SUBSTRATE FOR PROBE CARD APPLICATION

(75) Inventor: Tseng-Yang Hsu, San Marino, CA (US)

(73) Assignee: WinMEMS Technologies Holdings Co., Ltd., Tao Yuan Shien (TW)

( * ) Notice: Subject to any disclaimer, the term of this patent is extended or adjusted under 35 U.S.C. 154(b) by 152 days.

(21) Appl. No.: 12/388,034

(22) Filed: Feb. 18, 2009

(65) Prior Publication Data

US 2010/0207654 A1     Aug. 19, 2010

(51) Int. Cl.
*G01R 31/02* (2006.01)
*H01H 11/00* (2006.01)
*H01L 21/00* (2006.01)

(52) U.S. Cl. .......................... 324/756.04; 29/622; 438/50

(58) Field of Classification Search .................. None
See application file for complete search history.

(56) References Cited

U.S. PATENT DOCUMENTS

| | | | |
|---|---|---|---|
| 4,528,500 A * | 7/1985 | Lightbody et al. ............ 324/537 |
| 4,773,877 A | 9/1988 | Kruger et al. |
| 4,841,240 A * | 6/1989 | Hsue et al. ................. 324/754.1 |
| 5,798,283 A | 8/1998 | Montague et al. |
| 6,672,875 B1 | 1/2004 | Mathieu et al. |
| 6,784,680 B2 | 8/2004 | Haga et al. |
| 6,861,277 B1 * | 3/2005 | Monroe et al. .................. 438/48 |
| 6,965,245 B2 | 11/2005 | Kister et al. |
| 7,048,548 B2 | 5/2006 | Mathieu et al. |
| 7,078,921 B2 | 7/2006 | Haga et al. |
| 7,151,385 B2 | 12/2006 | Hirata et al. |
| 7,156,706 B2 | 1/2007 | Brown et al. |
| 7,190,179 B2 | 3/2007 | Haga et al. |
| 7,271,022 B2 * | 9/2007 | Tang et al. ...................... 438/48 |
| 7,285,966 B2 | 10/2007 | Lee et al. |
| 7,567,089 B2 | 7/2009 | Chen et al. |
| 7,586,321 B2 | 9/2009 | Hirakawa et al. |
| 7,644,490 B1 * | 1/2010 | Niblock et al. ................. 29/622 |
| 7,737,714 B2 * | 6/2010 | Hsu ......................... 324/755.11 |
| 7,776,631 B2 * | 8/2010 | Miles .............................. 438/29 |
| 2002/0163051 A1 * | 11/2002 | Gopal et al. ................... 257/414 |
| 2004/0245588 A1 * | 12/2004 | Nikkel et al. .................. 257/415 |
| 2005/0106772 A1 * | 5/2005 | Monroe et al. .................. 438/48 |
| 2005/0176212 A1 * | 8/2005 | Monroe et al. ................ 438/396 |
| 2006/0134819 A1 * | 6/2006 | Tang et al. ...................... 438/48 |
| 2006/0192581 A1 | 8/2006 | Lee |
| 2007/0018666 A1 * | 1/2007 | Barabi et al. .................. 324/761 |
| 2008/0007282 A1 * | 1/2008 | Hasegawa et al. ............ 324/757 |
| 2008/0111573 A1 | 5/2008 | Chen et al. |
| 2008/0184559 A1 | 8/2008 | Soma et al. |
| 2009/0144970 A1 * | 6/2009 | Hsu et al. ........................ 29/832 |

* cited by examiner

*Primary Examiner* — Jermele M Hollington
(74) *Attorney, Agent, or Firm* — Blakely, Sokoloff Taylor & Zafman

(57) ABSTRACT

A Micro-Electro-Mechanical-Systems (MEMS) interconnection pin is fabricated on a sacrificial layer, which is formed on a conductive layer and a substrate. The MEMS interconnection pin has a pin base attached to a frame that has direct contact to the conductive layer. The sacrificial layer is then removed, at least partially, to detach the MEMS interconnection pin from the substrate. In one embodiment, the MEMS interconnection pin has a pin base, two springs extending out from two different surfaces of the pin base, and a tip portion attached to each spring. The tip portions include one or more contact tips to make contact to conductive subjects.

18 Claims, 12 Drawing Sheets

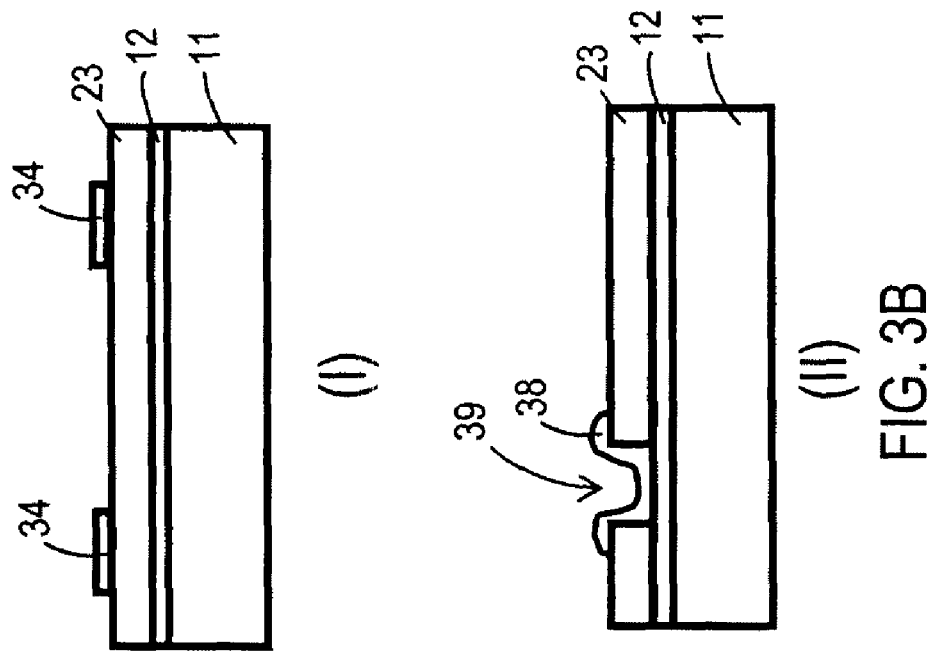
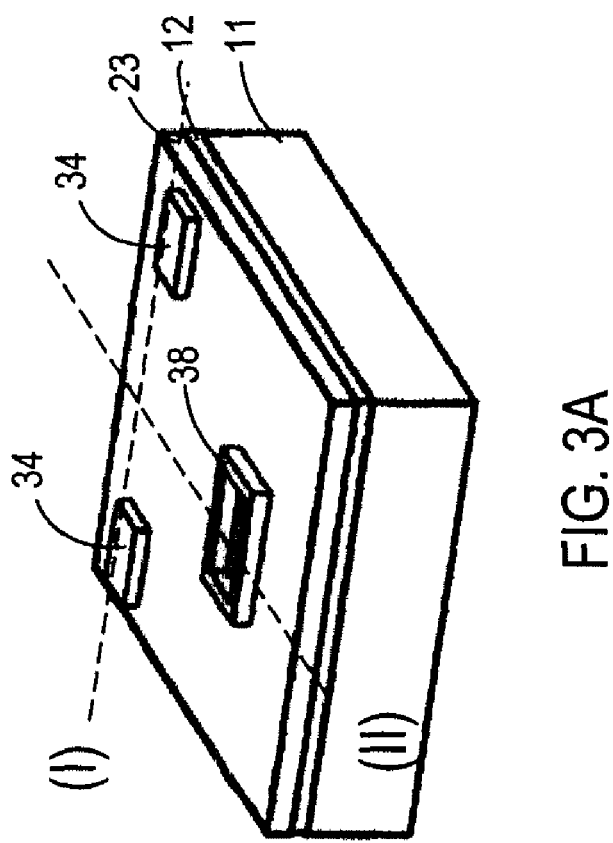
FIG. 3A
FIG. 3B

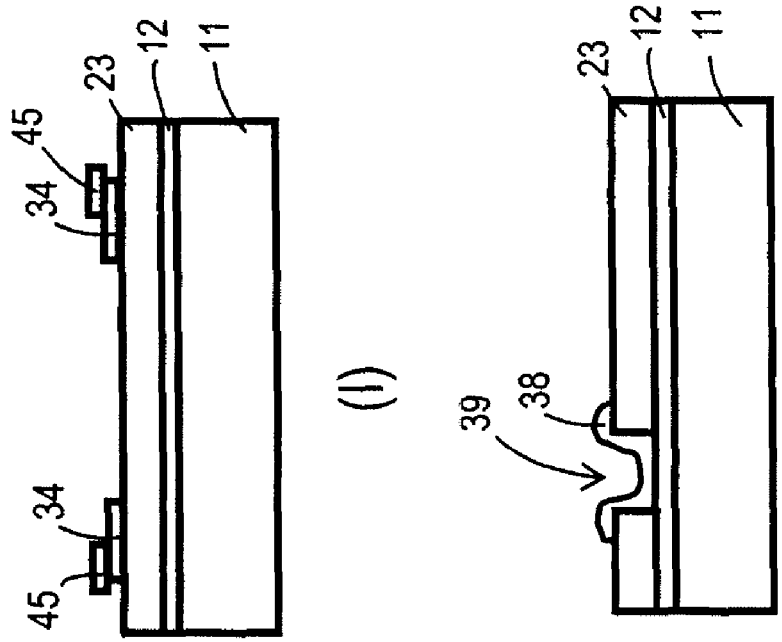
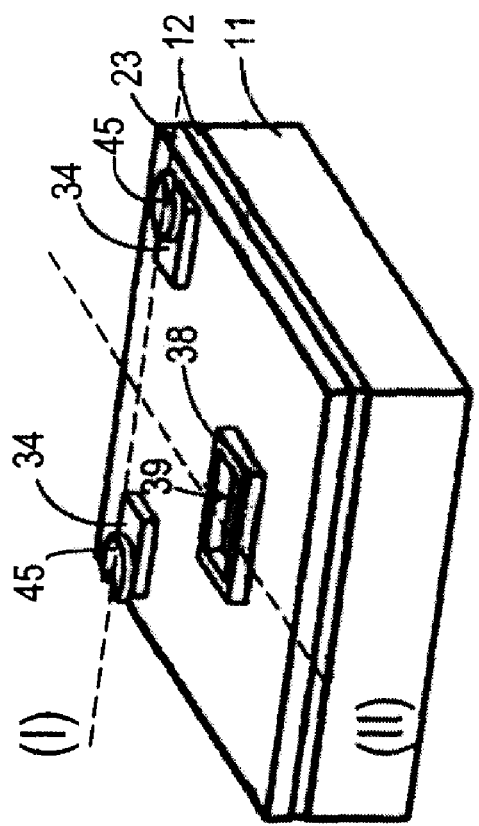
FIG. 4A
FIG. 4B

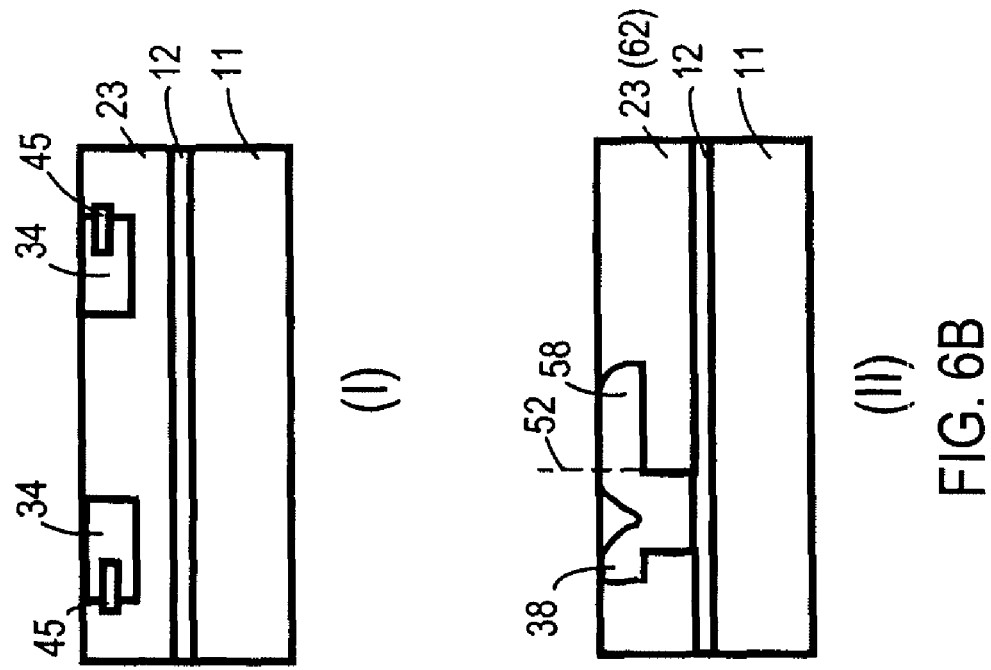
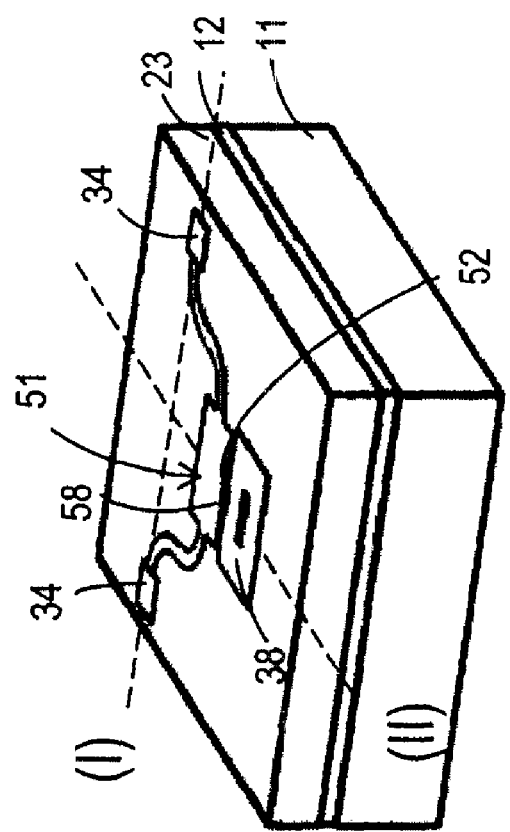
FIG. 6A
FIG. 6B

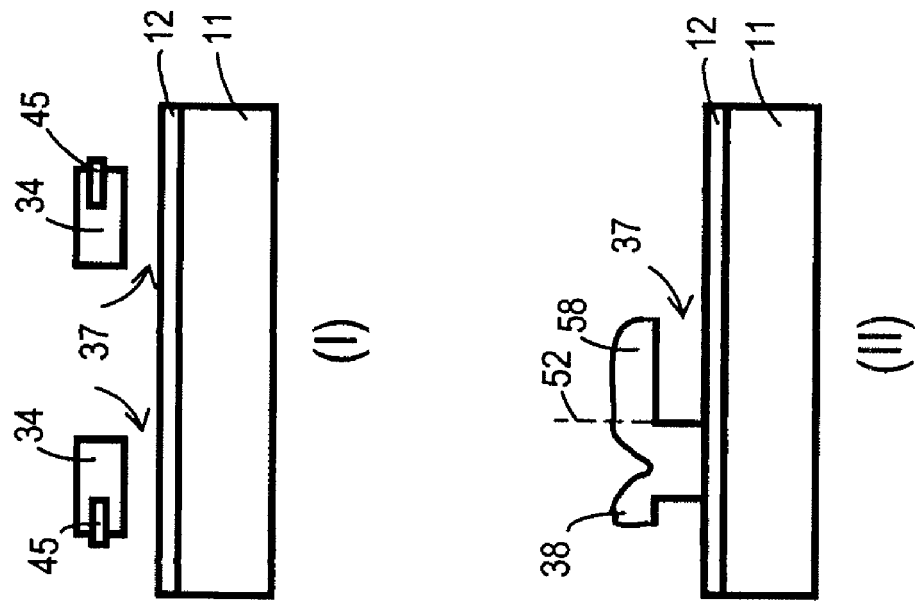
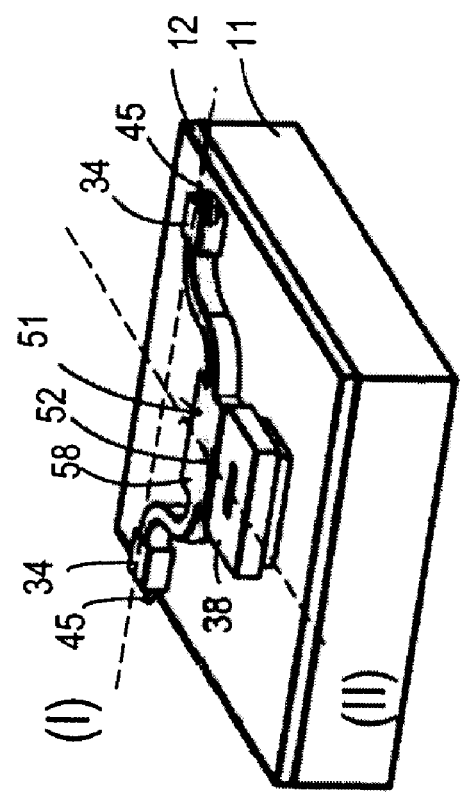
FIG. 7A
FIG. 7B

Guiding unit 121

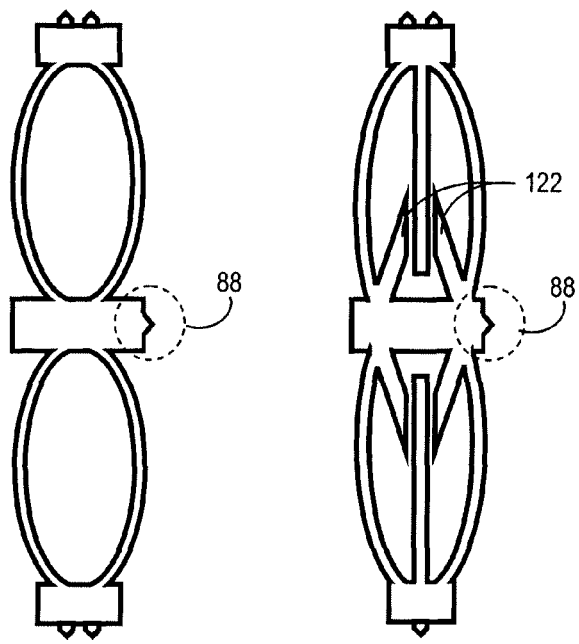
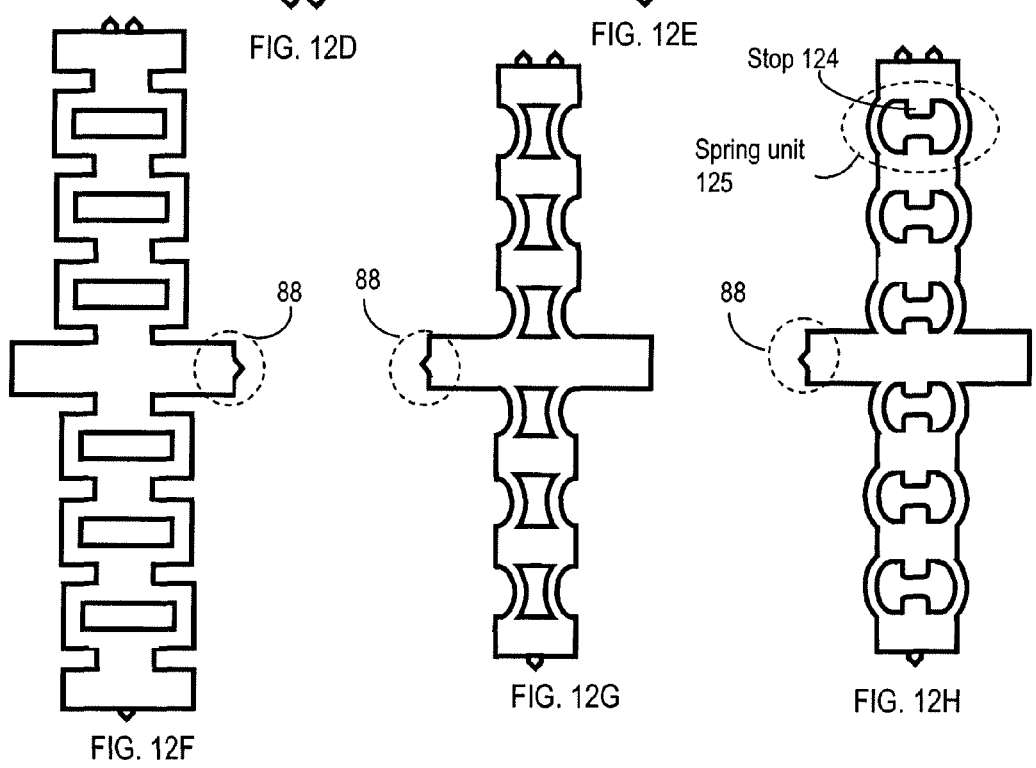
FIG. 12D  FIG. 12E  FIG. 12F  FIG. 12G  FIG. 12H

MEMS INTERCONNECTION PINS FABRICATION ON A REUSABLE SUBSTRATE FOR PROBE CARD APPLICATION

FIELD OF THE INVENTION

At least one embodiment of the present invention pertains to Micro-Electro-Mechanical Systems (MEMS), and more particularly, to the fabrication of MEMS interconnection pins.

BACKGROUND

Micro-Electro-Mechanical Systems (MEMS) is the integration of mechanical elements, sensors, actuators, and electronics on a common substrate, such as a silicon substrate, through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices.

A MEMS device includes small structures with dimensions in the micrometer scale (one millionth of a meter). Significant portions of the MEMS technology have been adopted from integrated circuit (IC) technology. For instance, similar to ICs, MEMS structures are, in general, realized in thin films of materials and patterned with photolithographic methods. Moreover, similar to ICs, MEMS structures are, in general, fabricated on a wafer by a sequence of deposition, lithography and etching.

With the increasing complexity of MEMS structures, the fabrication process of a MEMS device also becomes increasingly complex. For example, an array of MEMS probes and/or an array of MEMS interconnection pins can be assembled into a probe card. A probe card is an interface between an electronic test system and a semiconductor wafer under test. A probe card provides an electrical path between the test system and the circuitry on the wafer, thereby enabling the testing and validation of the circuitry at the wafer level, before the chips on the wafer are diced and packaged. Probes are assembled on a front side of a probe array platform. During a test, the probes form an electrical contact to the circuitry under test to make measurements. The measurements are sent, via conductive paths built in the probe platform, to the backside of the probe array platform. Interconnection pins electrically connect the backside of the probe array platform to a printed circuit board (PCB), which is connected to a test system that analyzes the measurements.

Conventionally, probes, as well as interconnection pins, are fabricated on a single substrate that has multiple layers deep in the vertical direction (with respect to the surface of the substrate), using a sequence of deposition steps across an entire wafer. A concern with the conventional methodology is that a defect or contamination occurring in any deposition step and in any individual probe may cause the entire wafer to fail. Further, the designs of probe shapes are usually restricted by the conventional processes that deposit layers of probe materials in a direction along the longitudinal axis of the probe spring. These conventional processes create the vertical, multi-dimensional structure of a probe, using multiple lithographic steps to pile and connect every layer of probe materials. As a result, the final structure (e.g., the probe spring and the pin spring) tends to have a jagged and uneven outline and lacks smooth transitions among the layers. Thus, there is a need to improve the conventional fabrication process in order to increase the yield, reduce the lead time and costs, and improve the design of the probes.

BRIEF DESCRIPTION OF THE DRAWINGS

One or more embodiments of the present invention are illustrated by way of example and not limitation in the figures of the accompanying drawings, in which like references indicate similar elements and in which:

FIGS. 3A-3B illustrate the formation of the bottom parts of tip bases and a frame.

FIGS. 4A-4B illustrate the formation of contact tips.

FIGS. 6A-6B illustrate a planarization operation.

FIGS. 7A-7B illustrate the removal of the first sacrificial layer.

FIGS. 12A-12H illustrate variations of pin designs.

DETAILED DESCRIPTION

Figure 1A:
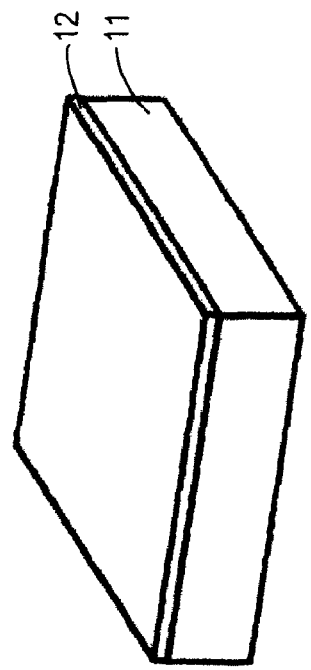
FIGS. 1A-1B illustrate a perspective view and a cross-section view of a substrate on which a conductive layer is formed.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

A technique for fabricating Micro-Electro-Mechanical Systems (MEMS) interconnection pins for electrically connecting two conductive surfaces is described. The MEMS interconnection pins (also referred to as "pins") are fabricated on a substrate for use on another platform, such as a guiding plate of a probe card. In one embodiment, each pin includes a pin base, one or more springs, and one or more tip portions. The pin is formed in a "lying" position, which means that the pin is lying on a plane parallel with the surface of the substrate. The pin is detached from the substrate by forming an undercut beneath the pin and breaking the pin base from an anchoring structure ("frame") on the substrate. The pin is then attached to an application platform ("a guiding plate") of a probe card. During the attachment process, the pin is lifted up to a "standing" position such that only the pin base is attached to the guiding plate. After the pin is into a slot of the guiding plate, one side of the pin is in contact with the back side of a probe substrate, and the other side in contact with a probe card printed circuit board (PCB).

The interconnecting pins described herein can be used in connection strips, connectors, test sockets, and semiconductor testing equipment, as well as probe cards. Traditional processes of making interconnect pins (also known as "pogo pins") typically suffer from problems in uniformity, yield, long lead time for volume production, and high cost. MEMS processes allow batch production, high volume, low cost, and short lead time.

In one embodiment, a pick-and-place process is described. In a pick-and-place process, MEMS interconnection pins (or "pins") are individually detached ("picked") from a substrate, and then attached ("placed") to an application platform in an unpackaged state. This "pick-and-place" technique not only improves the yield of the probes, but also greatly increases the flexibility with respect to how the pins are fabricated and used. For example, the array of pins may be detached from the substrate concurrently, or one or more parts at a time. Each of the pins may be attached to the same or different application platforms. Further, the pins attached to the same application platform may be fabricated on the substrate in a first arrangement and then attached to the application platform in a second arrangement, where the first arrangement and the second arrangement may have different spacing between the pins, different orientations of the pins, or a combination of both.

As pins are fabricated on a substrate different from the platform used for the final application, the yield of the individual pins does not directly affect the yield of the final product. A selection process of acceptable pins may be performed before the pins are assembled on the probe cards. Defective pins may be discarded before the attachment process, or left on the substrate.

The term "MEMS interconnection pin" or "pin" herein refers to a pin fabricated by MEMS technology. It is understood that the technique described herein can be applied to other MEMS parts (e.g., mechanical parts, optical parts, electrical parts, or the like). Typically, a MEMS part has dimensions ranging from 10×10×10 μm to 5000×5000×5000 μm. Examples of a MEMS part include a probe, an interconnection pin, a laser module, optical lenses, micro-gears, micro-resistors, micro-capacitors, micro-inductors, micro-diaphragms, micro-relays, micro-springs, waveguides, micro-grooves, and the like.

The term "substrate" herein refers to the substrate used in the fabrication process, without involvement in the operations of the probes, interconnection pins and the probe card. The shape of the substrate can be circular or rectangle. Examples of a substrate for fabricating MEMS interconnection pins include, but are not limited to, ceramics, glasses, metal plates, plastic plates, any dielectrics, and semiconductor (e.g., silicon (Si)) wafers. A non-silicon substrate, compared to a Si-based substrate, offers a larger number of standard sizes and is available as a thicker and non-circular standard substrate. Further, some non-silicon substrates are inert to most chemicals used during fabrication processes. Most substrates, including a Si-based substrate, can be processed with the MEMS parts thereon. Processed materials on the substrates can be later removed or dissolved without damaging the substrates. Therefore, the substrate for fabricating pins, as described herein, is a "reusable substrate," unless otherwise indicated. A reusable substrate can be reused for a next batch of pins fabrication after the pins are detached therefrom and residual substances are removed.

The term "application platform" herein refers to a part of a probe card which provides a platform to which the fabricated products (e.g., probes or pins) are attached. The application platform is electrically connected to a printed circuit board (PCB) that interfaces an electronic test system. An application platform may include, but is not limited to, semiconductor, glass, ceramics (e.g., low-temperature co-fired ceramics (LTCC), high-temperature co-fired ceramics (HTCC)), metal, other dielectric materials, organic materials, or any combinations of the above. In addition to probes or pins, an application platform may include components such as electrical connection, electrical contact, electrical isolation, electrical grounding, integrated circuit (IC) module, application specific IC (ASIC) module, dielectric patterning, conducting opening definition, mechanical support, mechanical protection, thermal conduction, electrostatic discharge (ESD) protection, confinement for parts, and wire bonding pads.

It is understood that the pins used in a probe card may be fabricated from one or more reusable substrates. The pins used in a probe card may be of different orientations, shapes, sizes and materials. The location of the pins in the probe card can be customized.

Referring to FIGS. 1-7, an embodiment of a process for fabricating a MEMS interconnection pin (also referred to as "pin") on a substrate is shown. The process is shown in both perspective views and cross-section views. All of the figures labeled with "A" show perspective views, and all of the figures labeled with "B" show cross-section views. Some standard or routine processing operations that are not directly relevant to the subject matter of the present invention, but are easily understood by a person of ordinary skill in the art, may be omitted from the following descriptions. Although a two-sided pin is shown in FIGS. 1-7, the process described below can also be applied to the fabrication of one-sided pin.

Figure 1B:

FIGS. 1A and 1B show a blanket metal layer 12 (e.g., gold or other conductive material(s)) formed on a substrate 11. To improve adhesion to substrate 11, in one embodiment, the bottom of blanket metal layer 12 may be coated with a thin film (e.g., less than 1 micron, not shown), also referred to as a seed layer, that is made of a conductive material (e.g., a combination of chromium and gold) different from that of blanket metal layer 12. In one embodiment, blanket metal layer 12 is deposited by an electrical forming process (also know as electrodeposition), such as electrode plating. The seed layer is formed by a thin film deposition process, which can be thermal evaporation, e-beam evaporation, sputtering deposition, or the like.

Figure 2A:
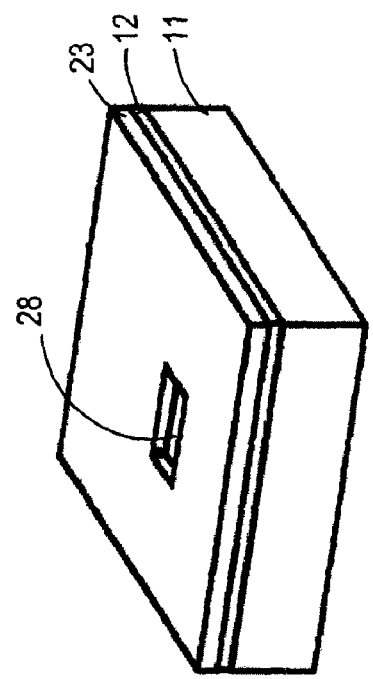
FIGS. 2A-2B illustrate a first sacrificial layer applied to the conductive layer, in which an opening is formed.
Figure 2B:
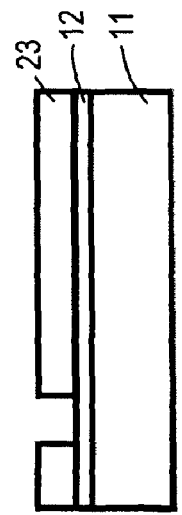

In FIGS. 2A and 2B, after blanket metal layer 12 is formed on substrate 11, a photoresist pattern is used to form a first sacrificial layer 23 that has an opening 28. First sacrificial layer 23 is made of a layer of metal (e.g., copper) or alloy, which is a material different from blanket metal layer 12 and the pin to be formed on substrate 11. First sacrificial layer 23 may be formed by electrical forming or other methods. In subsequent processing operations to be described below, first sacrificial layer 23 is to be removed from beneath the pin. In some embodiments, first sacrificial layer 23 may be planarized before further processing operations are performed. Planarization may be performed by a machine, such as a lapping machine, a diamond fly-cutter, or the like.

After first sacrificial layer 23 is formed, the photoresist is stripped to expose, through opening 28, blanket metal layer 12 or the seed layer (not shown). A first lithographic patterned mold (e.g., a photoresist mold, not shown) can then be used to define the shape of the bottom parts of tip bases 34 and a frame 38 (FIGS. 3A and 3B). The first lithographic patterned mold is placed on first sacrificial layer 23 and filled, by electrical forming, with a metal (e.g., nickel) or alloy material. The first lithographic patterned mold is to be removed after the bottom parts of tip bases 34 are formed. Alternatively, the first lithographic patterned mold can be removed in a subsequent processing operation, e.g., after the contact tips are formed, or after the pins are formed.

Frame 38 has direct contact with blanket metal layer 12 or the seed layer (if the seed layer is used). In one embodiment, frame 38 and the bottom parts of tip bases 34 are formed, by electrical forming, for the same period of time. Thus, the thickness of the bottom parts of tip bases 34 and frame 38 is substantially the same. As the side area of frame 38 is formed on top of first sacrificial layer 23 and the center area of frame 38 is formed on top of blanket metal layer 12 or the seed layer, the center area of frame 38 has a recess 39. In some embodiments, recess 39 may be filled by planarization. Depending on customer's specification, a planarization operation may be performed to flatten tip bases 34.

FIGS. 4A and 4B show the formation of contact tips 45 on top of corresponding bottom parts of tip bases 34, with a portion of each contact tip 45 protruding from the corresponding bottom parts of tip base 34. In one embodiment, contact tips 45 are formed by using a second lithographic patterned mold (e.g., a photoresist mold, not shown) to define the shape of contact tips 45. The second lithographic patterned mold is filled, by electrical forming, with a metal (e.g., rhodium) or alloy material different from the material of tip bases 34. The second lithographic patterned mold is to be removed after contact tips 45 are formed. Alternatively, the second lithographic patterned mold can be removed in a subsequent processing operation, e.g., after the pins are formed.

As shown in FIGS. 5A-5B and 6A-6B, after the formation of the bottom parts of tip bases 34 and contact tips 45, the rest of the pin and frame 38 are formed on substrate 11. In an embodiment where both (bottom parts of) tip bases 34 and the pin 51 (excluding contact tips 45) are formed by the same material (e.g., nickel), the bottom parts of tip bases 34 become part of pin 51 and are not explicitly shown in the following figures.

Figure 5B:
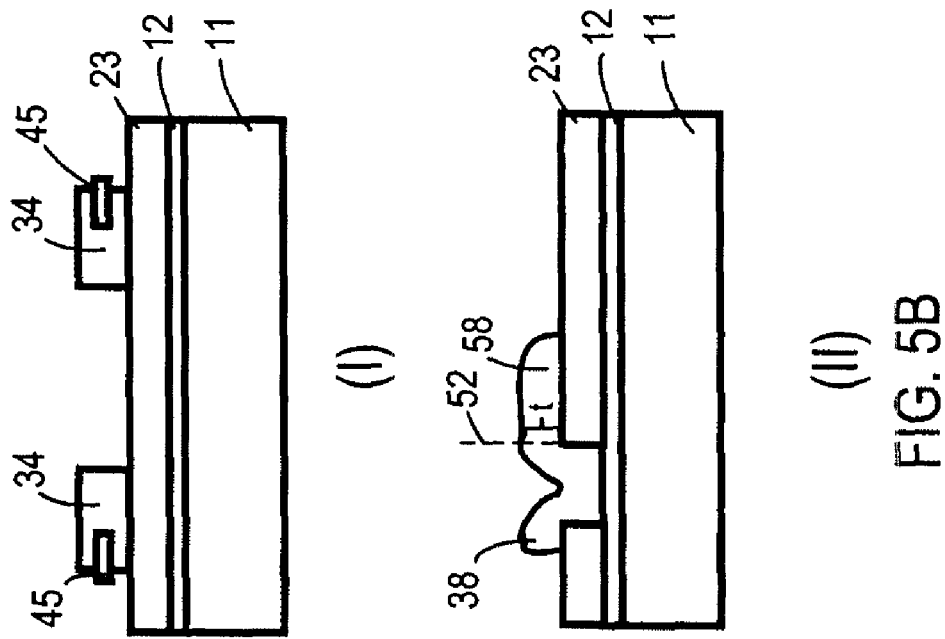
FIGS. 5A-5B illustrate the formation of the rest of a pin.
Figure 5A:
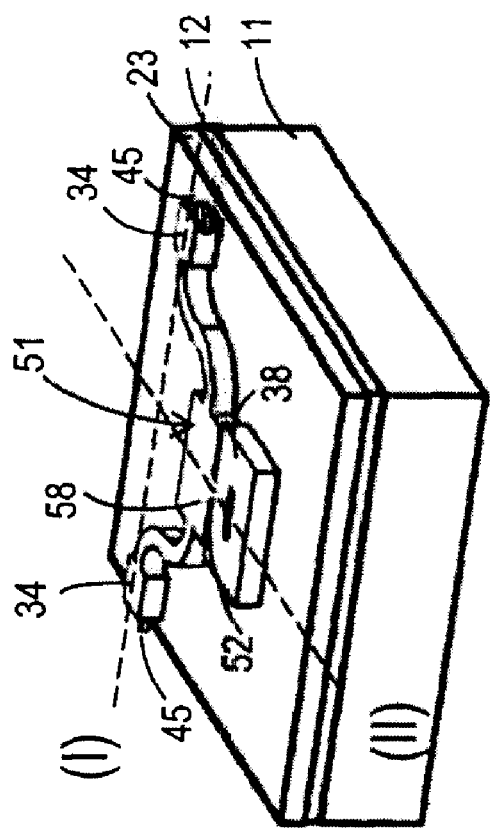

FIGS. 5A and 5B show a double-side pin 51 attached to frame 38. A third lithographic patterned mold (not shown) may be used to form the rest of pin 51 and frame 38. The third lithographic patterned mold is filled, by electrical forming, with a conductive material, such as a metal (e.g., nickel) or alloy. In some embodiments, the first, second and third lithographic patterned molds may be made of the same materials, such as photoresist, or different materials.

The third lithographic patterned mold also defines the shape of an anchoring joint 52 between a pin base 58 and frame 38. Pin base 58 is located between the two sides of pin 51. Anchoring joint 52 is shaped to have deep V-cuts on both sides of the joint section that connects pin base 58 and frame 38. The cross-section of anchoring joint 52 (defined by a plane that cuts through the joint section of pin base 58 and frame 38) is a thin and narrow area. For example, anchoring joint 52 is shaped to have deep V-cuts on both sides, such that its cross-section has substantially the shape of a line, which extends along the thickness of the probe layer. The shape of anchoring joint 52 facilitates the detachment of pin 51 from frame 38 by external force.

Frame 38 at this point is anchored to blanket metal layer 12 or the seed layer. On substrate 11, pin 51 is formed in a "lying" position, which means that pin 51 is lying on a plane parallel with the surface of substrate 11. FIG. 5B shows the cross-section view of pin 51 along axis (I) and axis (II). In the "lying" position, a thickness dimension, t, of pin 51 is shown to be perpendicular to the surface of substrate 11. Axis (I) extends through both tip bases 34 and axis (II) extends along frame 38, anchoring joint 52 and pin base 58. Axis (II) may intersect axis (I) at a 90 degree angle or other angle. Both axes (I) and (II) are parallel to the surface of substrate 11. This "lying" position is opposed to a "standing" position when pin 51 is attached to an application platform. In the "standing" position, pin 51 is lifted up such that axis (I) (the line that connects tip bases 34) vertically goes through the application platform.

After pin 51 is formed, the surface of pin 51 can be planarized to control the thickness of pin 51 (FIGS. 6A and 6B). Pin 51 can be planarized to have substantially the same thickness on the plane parallel to the surface of substrate 11 to satisfy the customer's specification. To secure pin 51 during the planarization operation, a second sacrificial layer 62 is applied all over pin 51 beforehand. In a first embodiment, second sacrificial layer 62 is made of the same material as first sacrificial layer 23. After stripping or dissolving the previously-applied lithographic patterned molds, an electrical forming operation is performed to grow second sacrificial layer 62 (which is the same material as first sacrificial layer 23) that covers pin 51. In an alternative embodiment, second sacrificial layer 62 may be made of photoresist, or the same material as any of the previously-applied lithographic patterned molds. After the planarization, any remaining molding material or photoresist is stripped or dissolved first. Subsequently, remaining sacrificial material (e.g., first sacrificial layer 23, and, in the first embodiment, second sacrificial layer 62) is removed, e.g., by chemical etching or dissolving (FIGS. 7A and 7B). The etching or dissolving time can be performed until all of the sacrificial material is etched or dissolved. It is unnecessary to set a critical time to stop the etching or dissolving. As frame 38 is anchored to blanket metal layer 12 or the seed layer, complete removal of first sacrificial layer 23 does not completely detach pin 51 from substrate 11. The removal of first sacrificial layer 23 creates an undercut 37 beneath pin 51.

Pin 51 can be detached from frame 38 by applying a physical force at or near anchoring joint 52 manually or with a machine. Substrate 11 can be reused after frame 38 is etched or dissolved away.

The detachment of pin 51 can be performed by external force at or near anchoring joint 52, with respect to the surface of substrate 11. The external force, either laterally or upward, or by laser cutting, physically breaks the narrow connection at anchoring joint 52. After the narrow connection is broken, a "broken" surface is formed at a distal end of pin base 58, which is the side of pin base 58 that was previously connected to frame 38. This broken surface is distinguishable from a surface defined by conventional methods of probe formation that do not use external force to detach a probe from the substrate. In general, a surface formed by conventional methods is smooth and regularly shaped. A surface formed by forcibly breaking (such as the broken surface of pin base 58) is generally rough and substantially irregular. A person of ordinary skill in the art would be able to recognize this "signature" represented by the broken surface by examining the smoothness and shape of the surface. In a scenario where pin 51 is made of metal, the roughness and irregularity of a broken metal surface is visually discernable and distinguishable from a plated metal surface defined by photoresist or other sacrificial materials.

It is understood that the processing operations described above in FIGS. 1-7 can be used to fabricate multiple pins at the same time. In an alternative embodiment, the same processing operations for fabricating double-side pins can also be used to fabricate single-sided pins. A single-sided pin has a spring on only one side of its pin base. The pin base of a single-sided pin is connected to frame 38 via anchoring joint 52 and can be detached from frame 38 using the operations described above.

Figure 8:
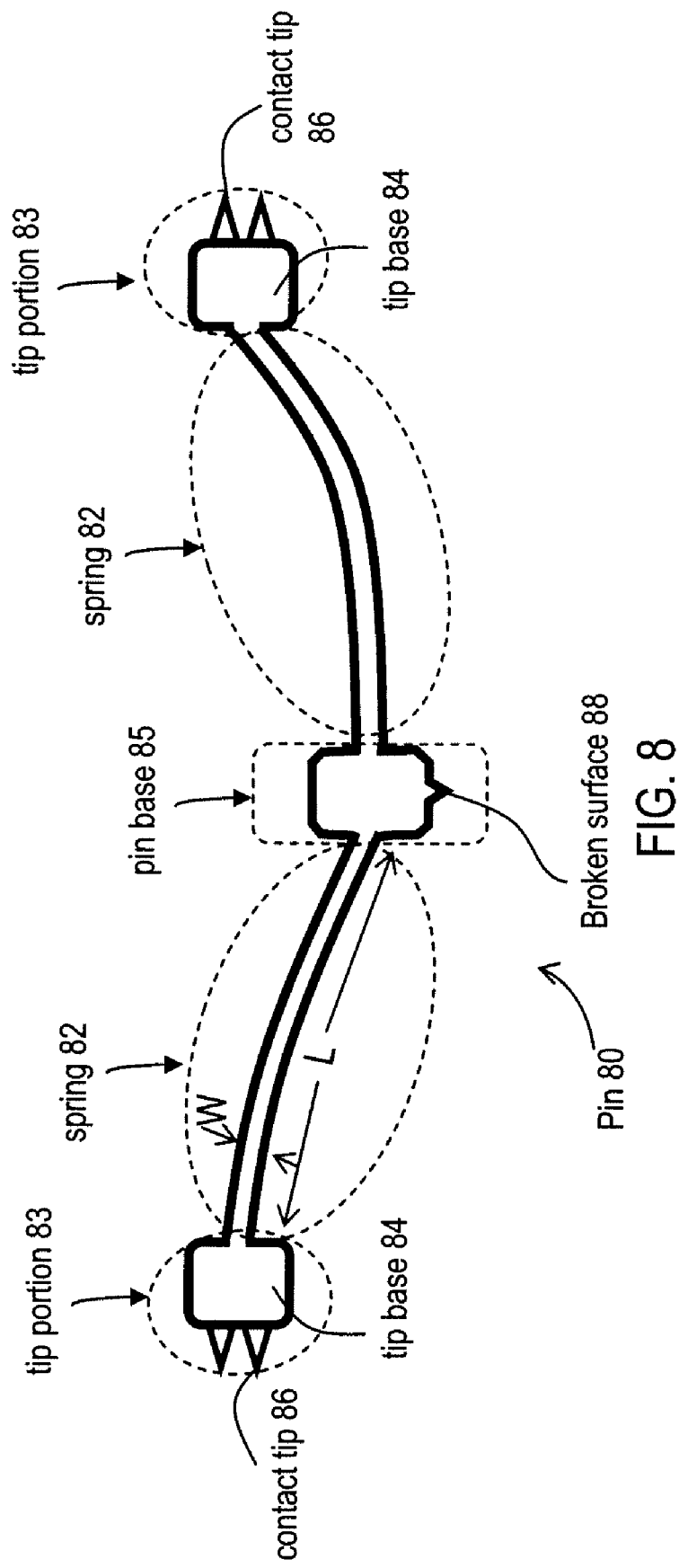
FIG. 8 illustrates a structure of a double-sided pin.

Referring to FIG. 8, the basic structure of a double-sided pin 80 includes a pin base 85, a spring 82 on each side (left and right as shown in FIG. 8) of pin base 85, and a tip portion 83 at the end of each spring 82. All of the parts of pin 80 can be customized to satisfy the requirements of different applications. As described above in connection with FIGS. 1-7, the pin structure described herein can be formed by at least three separate lithographic processes that form the bottom parts of tip bases 84, contact tips 86, and the rest of pin 80.

Pin base 85 has a broken surface 88 at one end, which was formed as a result of breaking pin 80 from its frame 38. Pin base 85 mechanically supports the rest of the pin structure and secures the pin to a platform for a particular application.

Each tip portion 83 includes tip base 84 and one or more contact tips 86 at each tip base 84. Tip base 84 supports contact tips 86 to form a contact to a conductive subject. Contact tips 86 are designed to be "sandwiched" by tip base 84 metal with its contacting area exposed. The shape of contact tips 86 can be designed such that pin 80 makes good electrical contact to a contacting material with a specified force. The two tip portions 83 do not necessarily have the same shape. The shapes of contact tips 86 in pin 80 and the number of contact tips 86 at each side of pin 80 are not necessarily the same. Some applications require a pin to make electrical contacts to two surfaces of different materials. Different and optimized tip shapes and number of contact tips 86, as well as different and optimized spring constants of springs 82, can be used to make the best contacts to the corresponding surfaces.

Springs 82 provide compliance force when pin 80 makes electrical contacts to the surfaces of the subjects to which pin 80 connects. Springs 82 extend out from opposite sides of pin base 85 to form a double-ended pin. The two springs 82 do not necessarily have the same shape and/or spring constant. The two springs 82 can be designed to have different shapes and/or spring constants suited for a certain application. In one embodiment, the shape of spring 82 is a fraction of a circle or a deformed circle (e.g., a half circle, a half ellipse, a quarter ellipse, or a quarter circle). Springs 82 can also be designed such that its width (shown as "W" in FIG. 8) varies along the spring length (shown as "L"). As the shape of springs 82 can be defined by one lithographic mold (the third lithographic patterned mold as described above) and formed in one lithographic operation (e.g., the processes described with reference to FIGS. 5A-5B above), the shape can have smooth curves of any curvatures, or other geometrical shapes. More lithographic steps can be used to provide variation to the shapes.

Figure 10:
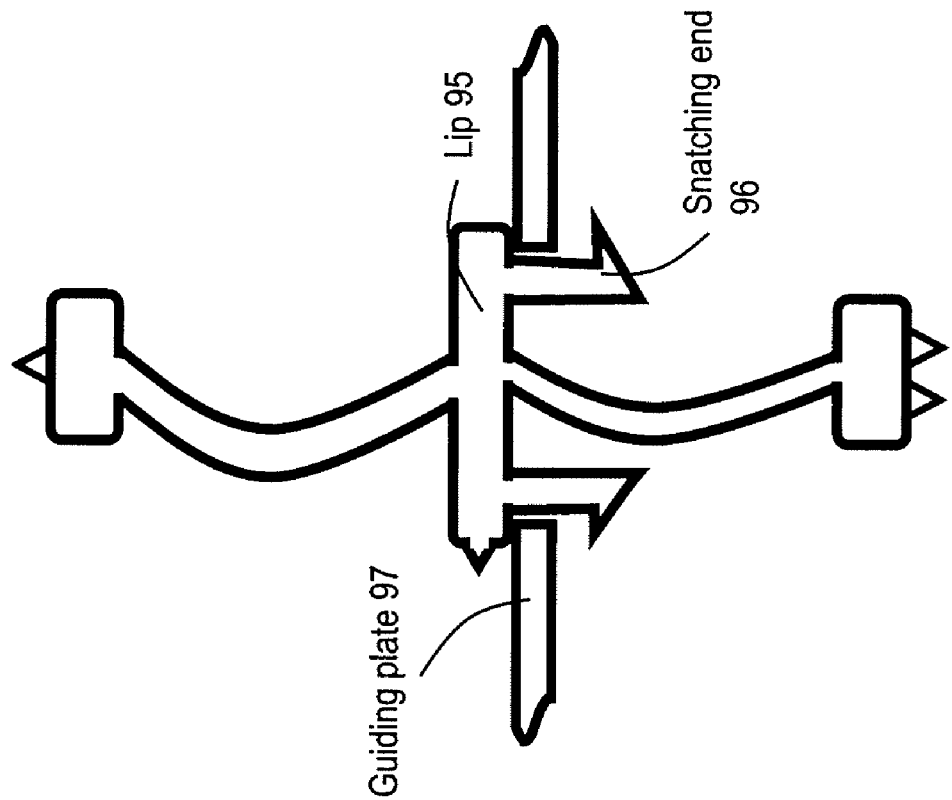
FIG. 10 illustrates the double-sided pin of FIG. 9 locked into a guiding plate.
Figure 9:
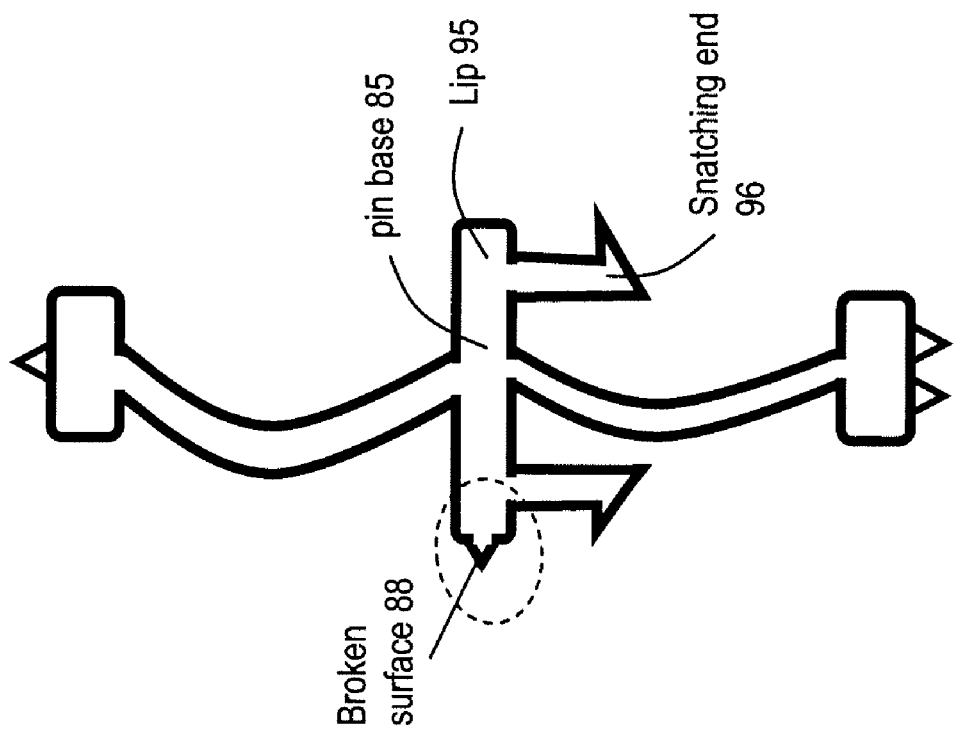
FIG. 9 illustrates a double-sided pin that has lips and snatching ends in the pin base.

As an example, doubled-sides pin 80 can be used to form a contact between a PCB (not shown) and a probe array platform (not shown) in a probe card. One end of pin 80 can contact the pad on the backside of the probe array platform and the other end contacts the PCB pad. In the embodiment shown in FIG. 9, pin base 85 can be designed to have "lips" 95 on the upper side and "snatching" ends 96 on the lower side. Lips 95 can be the portions of the pin base that extend out longitudinally at both ends. Multiple pins 80 can be inserted and locked into a guiding plate 97 that has slots at appropriate locations to form an array of pins. Pins 80 will then be locked into position by "lips" 95 and "snatching" ends 96 (FIG. 10). Good electrical contacts on every pad can be achieved when the PCB, guiding plate 97 (loaded with pins 80), and the probe substrate are properly aligned and an appropriate stacking force is applied to the alignment.

The shape of the pins can vary in design to meet the requirements of different applications. In an embodiment where the pin is one-sided, the pin can be metallically bonded or mechanically locked to a pad in a socket and used as a pin in a test socket.

Figure 11:
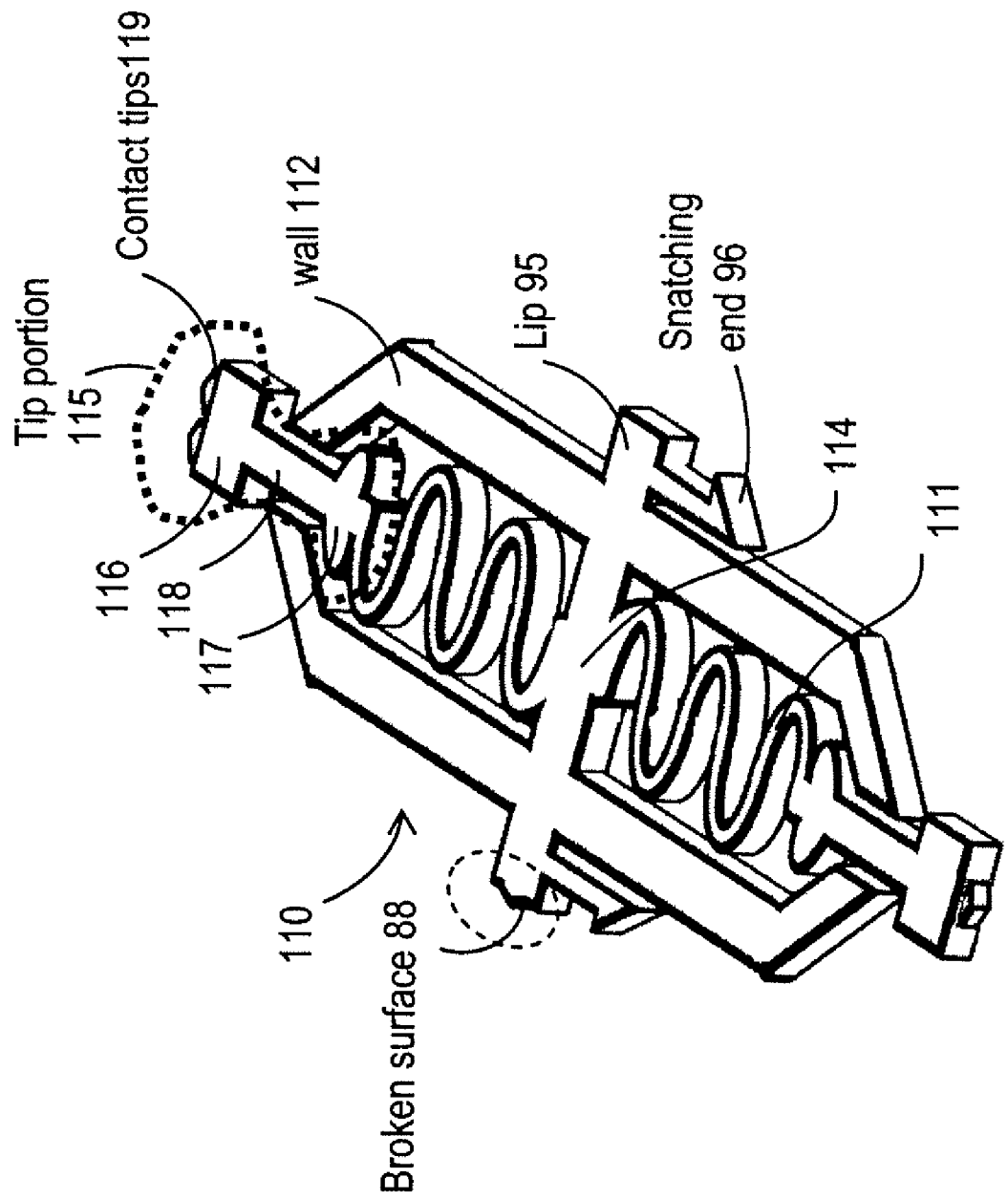
FIG. 11 illustrates a double-sided pin having guarding walls along both sides of the springs.

In another embodiment, the pin can be a double-sided pin 110 with "snake" shaped springs 111 protected by guarding walls 112 (FIG. 11). Guarding walls 112 serve to protect the spring 111 and to confine spring 111 within walls 112. In one embodiment, walls 112 structurally connect to and extend from a pin base 114, along both sides of springs 111, toward both sides of tip portions 115. In the embodiment shown in FIG. 11, each tip portion 115 includes a top area 116 immediately below contact tips 119 and a bottom area 117 immediate above spring 111. Top area 116 and bottom area 117 are connected by a thin neck 118, which is the location where walls 112 end. Thus, in this embodiment, walls 112 extend to confine springs 111 and to confine tip portions 115 partially (e.g., bottom area 117 is confined). Walls 112 serve to protect springs 111 and to confine the spring within the wall during spring compression. Walls 112 are tapered at the tip ends and the tip portion is designed to be tapered correspondingly, such that the tip portion is prevented from coming out of the walls. When making a contact during a test, a contact tip sometimes can get stuck to a pad or a solder ball. The tip constriction with the walls is good for separating the contact tip from the pad or the solder ball.

Additionally, in the embodiment shown in FIG. 11, the ends of walls 112 turn towards thin neck 118 of tip portion 115 to form an obtuse angle. That is, walls 112 have tapered ends at tip portions 115. In one embodiment, bottom area 117 of tip portion 115 has a top end that is shaped in conformity with the end of walls 112. Thus, the top end of bottom area 117 is tapered in the same way as the tapered end of walls 112. The conformity in shapes allows spring 111 to contact walls 112 by area, instead of by points, when the spring is stretched to the extent that bottom area 117 of tip portion 115 contacts the inner side of walls 112. In alternative embodiments, walls 112 the ends of walls 112 can turn towards thin neck 118 of tip portion 115 to form an acute angle or a right angle. The top end of bottom area 117 can be angled in the same way as the end of walls 112. It is understood that pin 110 can have one side protected by a wall and the other side unprotected by a wall. If both sides of pin 110 are protected by walls, the wall on each side does not necessarily have the same shape.

In this embodiment, pin 110 also has lips 95 and snatching ends 96 for locking into a guiding plate. In alternative embodiments, pin 110 pins can be designed to be single-sided, without guarding walls 112, and/or without lips 95 and snatching ends 96. Pin 110 can also be designed to have one spring shape on one side of pin base 114 and another spring shape on the other side of pin base 114. Pin 110, as well as all of the pins to be described below, has broken surface 88 at one end of its pin base 114 formed by detaching the pin during fabrication.

Figure 12C:
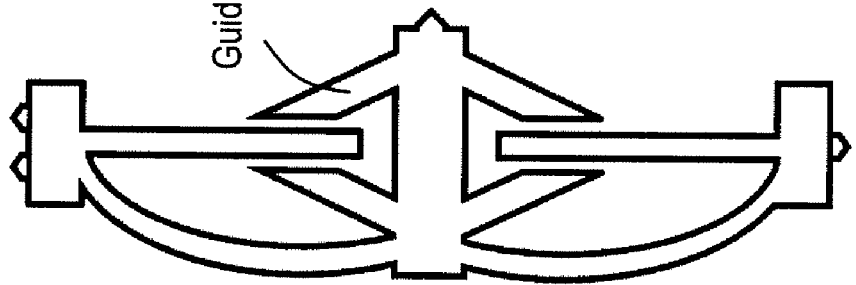
Figure 12B:
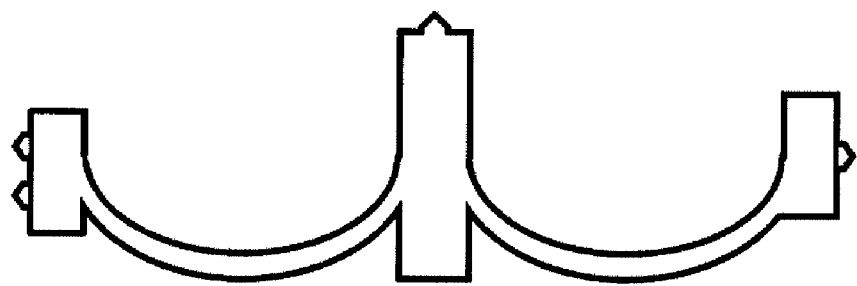
Figure 12A:
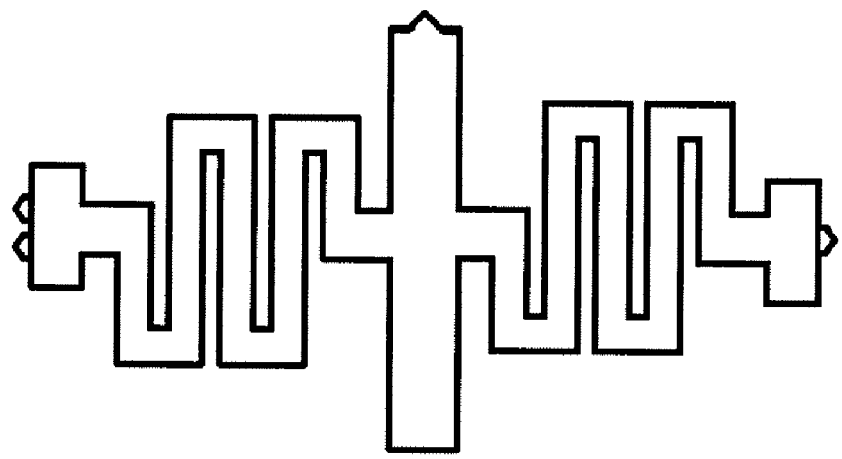

Other examples of double-sided pins include a "square" snake shaped pin (FIG. 12A), a curved pin with buckling spring force (FIG. 12B), a curved pin with guiding units 121 (extension of the pin base) for scrub displacement to confine the movement of the contact tips (FIG. 12C), a balanced two-curve buckling pin that has, on each side of the pin, two symmetrically curved compliant elements on the same plane (FIG. 12D), a balanced two-curve buckling pin with guiding units 122 (FIG. 12E), a stacked "rectangle" pin (FIG. 12F), a two-sided curve-in pin (FIG. 12G), and a two-sided curve-out pin with stops 124 in each spring unit 125 (FIG. 12H). In FIGS. 12C and 12E, guiding units 121 and 122 extend from the pin base and are used to confine the movement of the springs. Each guiding unit 121 and 122 has two guiding rails that form an opening to receive an extension of a corresponding tip base. All of the pins described herein can be designed to be single-sided, double-sided, with guarding/surrounding walls, and/or with lips and snatching ends. All of the pins described herein can also be designed to have a combination of one spring shape on one side of the pin base and another spring shape on the other side of the pin base.

Figure 13A:
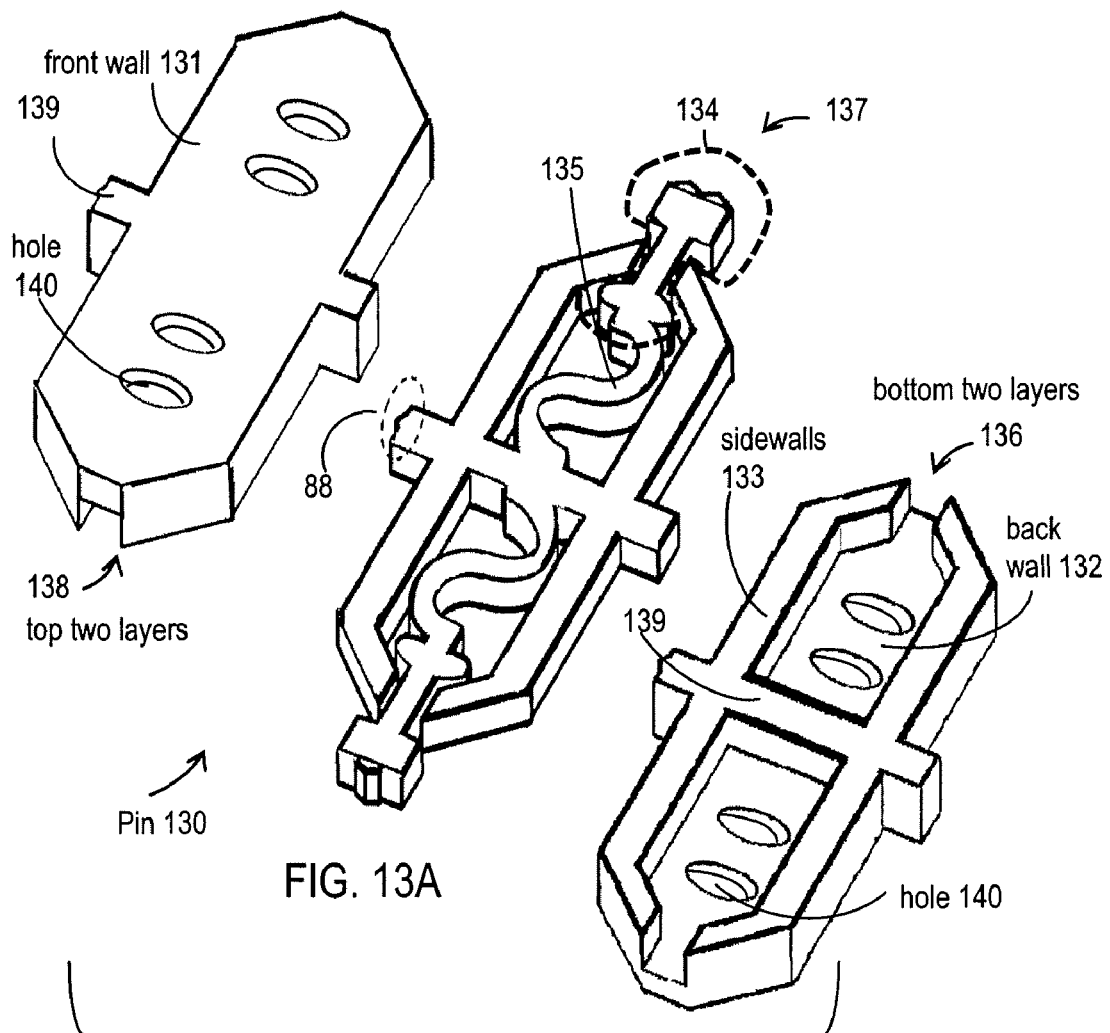
FIGS. 13A-13B illustrate a double-sided pin having surrounding walls.
Figure 13B:
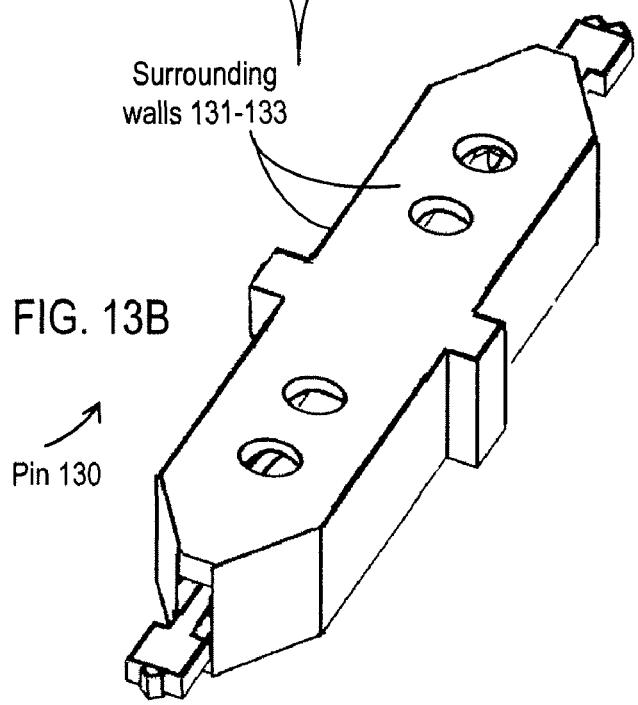

More complicated pin structure can be created by performing more processing operations and using more layers during fabrication. For example, a pin 130 can have springs 135 that are protected and confined by surrounding walls, e.g., walls that include a front wall 131, a back wall 132, and two side walls 133 (FIGS. 13A and 13B). FIG. 13A shows the layers of pin 130 and FIG. 13B shows a composite view of pin 130. Surrounding walls 131-133 structurally connect to a pin base 139. Surrounding walls 131-133 extend from pin base 139, along springs 135, toward tip portions 134. Surrounding walls 131-133 serve to protect springs 135 and to confine the springs within the walls during spring compression. Surrounding walls 131-133 can be tapered or angled at the ends and tip portions 134 can be designed to be tapered or angled correspondingly, such that the bottom areas of tip portions 134 are prevented from coming out of the walls.

In one embodiment, back wall 132 can be formed using one additional process layer before the formation of tip bases (e.g., the additional process can be performed between the operations of FIGS. 2A-2B and FIGS. 3A-3B), and a back layer of side walls 133 can be formed using one another process layer following the formation of back wall 132. A front layer of side walls 133 can be formed following the planarization operation of FIGS. 6A-6B (e.g., the process can be performed between the operations of FIGS. 6A-6B and FIGS. 7A-7B), and front wall 131 can be formed following the formation of the front layer of side walls 133. Bottom two layers 136 of pin 130 include back wall 132 and the back layer of side walls 133. Middle layer 137 include springs 135 formed within the walls that are partially formed, and top two layers 138 include front wall 131 and the front layer of side walls 133. With the four additional processing layers, springs 135 can move in all directions within the confinement of walls 131-133. It is understood that springs 135 can be any of the springs shown in FIGS. 9-12, and can have different shapes and/or spring constants on each side. Pin 130 can be either one-sided or double-sided, with or without lips and snatching ends. The surrounding walls 131-133 are part of and an extension of pin base 139. In one embodiment, front wall 131 and back wall 132 have holes 140 on the walls for the purpose of forming an undercut faster during sacrificial etching (referring to the operations of FIGS. 7A-7B). With these holes, etching chemicals can go faster underneath or into the pin structure during removal of sacrificial layer for pin release.

Thus, a technique for fabricating MEMS interconnection pins on a substrate has been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A method comprising:
   forming a conductive layer on a substrate;
   forming a sacrificial layer on the conductive layer;
   forming a Micro-Electro-Mechanical Systems (MEMS) interconnection pin on the sacrificial layer, the MEMS interconnection pin comprising a pin base attached to a frame that has direct contact to the conductive layer, the MEMS interconnection pin further comprising double-sided springs connected to the pin base, the pin base comprising an upper lip and a snatching end for placement in a slot of a plate; and
   removing at least partially, the sacrificial layer to detach the MEMS interconnection pin from the substrate.

2. The method of claim 1, further comprising:
   detaching the MEMS interconnection pin from the substrate by breaking a joint located between the pin base and the frame.

3. The method of claim 1, wherein forming the sacrificial layer on the conductive layer further comprises:
   forming the sacrificial layer on the conductive layer, the sacrificial layer having an opening to expose the conductive layer; and
   forming the pin and the frame on the sacrificial layer, the frame having direct contact to the conductive layer through the opening.

4. The method of claim 1, wherein forming the MEMS interconnection pin further comprises:
   forming a bottom part of a tip base of the pin in a first lithographic operation;
   forming one or more contact tips on the tip base in a second lithographic operation; and
   forming a remaining portion of the pin on the substrate in a third lithographic operation.

5. The method of claim 4, further comprising:
   forming walls that structurally connect to the tip base and extend along the MEMS interconnection pin.

6. The method of claim 1, wherein the MEMS interconnection pin comprises:
   two springs extending out from two opposite surfaces of the pin base; and
   two tip portions, each tip portions attached to an end of one of the springs.

7. A Micro-Electro-Mechanical Systems (MEMS) interconnection pin for making electrical contacts between two conductive subjects, the MEMS interconnection pin comprising:
   a pin base having a broken surface at one end;
   two springs extending out from two opposite surfaces of the pin base; and
   two tip portions, each tip portions attached to an end of one of the springs, each tip portion including one or more contact tips to make contact to one of the conductive subjects,
   wherein at least one of the springs has two symmetrically curved elements on the same plane.

8. The MEMS interconnection pin of claim 7, wherein the two springs have different shapes or different spring constants.

9. The MEMS interconnection pin of claim 7, wherein the two tip portions have different numbers of contact tips or different shapes of contact tips.

10. The MEMS interconnection pin of claim 7, wherein the pin base includes lips and snatching ends for locking into a slot of a platform.

11. The MEMS interconnection pin of claim 7, wherein the pin base has two guiding units that extend out from the pin base, each guiding unit to receive an extension of a corresponding tip portion to confine movement of a corresponding spring.

12. The MEMS interconnection pin of claim 7, further comprising:

a guarding wall, which connects to and extends from the pin base, along two sides of the springs, toward the tip portions.

13. The MEMS interconnection pin of claim 12, wherein the wall is tapered at the tip end and the tip portion has corresponding tapered part.

14. The MEMS interconnection pin of claim 7, further comprising:

walls surrounding the spring and partially the tip portion for protection and confinement, the walls being part of the pin base extending to surround the spring and partially tip portion.

15. The MEMS interconnection pin of claim 14, wherein the walls include multiple holes.

16. A Micro-Electro-Mechanical Systems (MEMS) interconnection pin for making electrical contacts between two conductive subjects, the MEMS interconnection pin comprising:

a pin base comprising an upper lip and a snatching end for placement in a slot of a plate, the upper lip having a broken surface at one end;

a spring extending out from a surface of the pin base; and a tip portion attached to an end of the spring, the tip portion including one or more contact tips to make contact to one of the conductive subjects.

17. The MEMS interconnection pin of claim 16, further comprising:

a second spring extending out from a different surface of the pin base; and a second tip portion attached to an end of the second spring, the second tip portion including one or more contact tips to make contact to the other one of the conductive subjects.

18. The MEMS interconnection pin of claim 16, wherein the pin base includes lips and snatching ends for locking into a slot of a platform.

* * * * *